US006645353B2

(12) United States Patent
Huff et al.

(10) Patent No.: US 6,645,353 B2
(45) Date of Patent: *Nov. 11, 2003

(54) APPROACH TO OPTIMIZING AN ILD ARGON SPUTTER PROCESS

(75) Inventors: Brett E. Huff, Fremont, CA (US); Ken Schatz, Palo Alto, CA (US); Mike Maxim, San Jose, CA (US); William G. Petro, San Jose, CA (US)

(73) Assignee: Intel Corporation, Santa Clara ( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,350

(22) Filed: Dec. 31, 1997

(65) Prior Publication Data

US 2003/0136664 A1 Jul. 24, 2003

(51) Int. Cl.[7] .............................................. C23C 14/35
(52) U.S. Cl. .................................................. 204/192.32
(58) Field of Search ....................... 204/192.32, 298.31, 204/298.37

(56) References Cited

U.S. PATENT DOCUMENTS

| 4,761,219 A | * | 8/1988 | Sasaki et al. ............... 204/298 |
| 4,838,978 A | | 6/1989 | Sekine et al. ............... 156/345 |
| 4,963,242 A | * | 10/1990 | Sato et al. .............. 204/298.31 |
| 5,079,481 A | * | 1/1992 | Moslehi .................. 315/111.41 |
| 5,108,535 A | | 4/1992 | Ono et al. .................... 156/345 |
| 5,160,398 A | * | 11/1992 | Yanagida ..................... 156/345 |
| 5,246,532 A | * | 9/1993 | Ishida ......................... 156/345 |
| 5,279,669 A | | 1/1994 | Lee ..................... 118/724 MR |
| 5,399,253 A | * | 3/1995 | Grunenfelder ........... 204/298.2 |
| 5,401,351 A | * | 3/1995 | Samukawa ................... 156/345 |
| 5,421,891 A | * | 6/1995 | Campbell et al. ....... 118/723 R |
| 5,733,405 A | * | 3/1998 | Taki et al. ................... 156/345 |

FOREIGN PATENT DOCUMENTS

JP      5-263237   * 10/1993   ........... C23C/14/35

OTHER PUBLICATIONS

Merriam Webster's Collegiate Dictionary, 10th Edition, p. 47 (1996).*

* cited by examiner

Primary Examiner—Steven H. VerSteeg
(74) Attorney, Agent, or Firm—Blakely, Sokoloff, Taylor & Zafman LLP

(57) ABSTRACT

A sputter etch system and a method of conducting a sputter etch. The sputter etch system includes an etch chamber with a wafer pedestal having a top surface to support a wafer and a magnet configured to provide a continuous magnetic field directed at the top surface of the wafer pedestal.

10 Claims, 6 Drawing Sheets

APPROACH TO OPTIMIZING AN ILD ARGON SPUTTER PROCESS

BACKGROUND OF THE INVENTION

1. Field of the Invention

The invention relates to the field of integrated circuit manufacturing and more particularly to etch processes in the manufacture of integrated circuits.

2. Description of Related Art

In the fabrication of semiconductor-based integrated circuit devices or chips, numerous conductive regions and layers are formed in or on a semiconductor substrate. To isolate underlying regions or layers, an interlayer dielectric (ILD) is formed over those regions. In most modern ILD processes, chemical vapor deposition (CVD) is used to deposit the ILD. In a CVD process, a solid film of, for example, oxide is formed on a substrate by the reaction of an oxide source gas and the substrate. The gas mixture, temperature, RF power, pressure, and gas flow rate, among other factors, may be varied in the CVD process to achieve the desired characteristics of the ILD.

In general, the ILD has to conform to exacting specifications. One standard provides that there should be no voids between metal (signal) lines at any layer that is above the metal surface and void height, or greater than 25% of the metal spacing and void width. Another standard also provides that composite ILD stress at the post-polished thickness should be between $1.0 \times 10^8$ to $9.0 \times 10^8$ dyne/cm$^2$, compressive. If the ILD is not compressive enough, it is subject to cracking and short circuits. If the ILD is too compressive, it may provide poor oxide metal adhesion that can lead to open circuits within the device.

There are a number of methods of depositing an ILD. One method is shown in FIGS. 1–5. In FIG. 1, substrate 10 represents a semiconductor substrate and any device layers or structures underlying conductive, e.g., metal, structures 11 thereon. Metal structures 11 include, for example, tungsten (W), aluminum (Al), aluminum-copper (Al—Cu) alloy, or aluminum-copper-silicon (Al—Cu—Si) alloy. In order to isolate metal structures 11 from subsequent layers, a first dielectric layer 30 is deposited using, for example, a plasma-enhanced CVD method. In one example, tetraethylorthosilicate (TEOS) is used as the oxide source in the deposition. FIG. 2 shows the conformal deposition of first dielectric layer 30 over substrate 10 and metal structures 11.

Once dielectric layer 30 is deposited, FIG. 3 shows the subsequent processing step wherein the deposition profile of first dielectric layer 30 is tapered by a sputter etch 40, such as for example, an argon sputter etch. As a general proposition, argon sputter etching removes approximately four times more material from 45° angles than from horizontal surfaces. Therefore, corners are reduced to a much greater extent than level surfaces. A portion of removed dielectric layer 30 from the upper edges, is redeposited in areas between metal structures 11. The redeposited dielectric material is represented by reference numeral 45 in FIG. 3. Redeposited dielectric 45 helps to taper the deposition profile of first dielectric layer 30.

FIG. 4 shows the further processing step wherein second dielectric layer 50 of, for example, oxide is conformally deposited over the structure, also using, for example, a plasma-enhanced CVD method with TEOS as the oxide source. Second dielectric layer 50 is generally thicker than first dielectric layer 30. In one example, first dielectric layer 30 is deposited to a thickness of approximately 2,000–5,800 Å while second dielectric layer is deposited to a thickness of approximately 15,000–30,000 Å Second dielectric layer 50 is then planarized as illustrated in FIG. 5 by, for example, a chemical-mechanical polish such as a silicon dioxide (SiO$_2$) slurry in potassium hydroxide (KOH) and water.

Directing attention to the sputter etch described above, prior art sputter etchers of ILD are typically performed at high pressure and zero gauss. Using a high pressure and zero gauss sputter etch results in a reduction of the mean free path which increases the redeposition rate of the dielectric material. This improves the gapfill between metal lines 11 and the amount of dielectric that is redeposited 45. Additionally, the elimination of magnetic fields (i.e., zero gauss) reduces the possibility of gate oxide "charging." Gate oxide charging occurs when the sputter etch proceeds too far and exposes a portion of metal line 11 to plasma energy. The plasma energy into the exposed metal damages the gate oxide of, for example, a transistor to which the metal line 11 is attached.

FIG. 6 shows a conventional etch system for conducting a sputter etch. Etch system 70 includes etch chamber 75 attached to seat 80. Inside etch chamber 75 is a pedestal 85 that supports a wafer for processing. An argon plasma is introduced into etch chamber 75 through a gas distribution plate 97. The argon plasma bombards the top surface of wafer 90 as part of the etch process. A commonly used etcher is for example the AMAT5000™ manufactured by Applied Materials. The AMAT5000™ includes magnets 95, on its outer surface, over etch chamber 75, including magnet(s) 95 adjacent the top surface and magnetic coils 95 adjacent the side of etch chamber 75. The magnets provide a pulsed electromagnetic field to aid in various plasma etch processes.

FIG. 7 illustrates a top view of etch system 70, such as the AMAT5000™, having an etch chamber 75 with magnets 95 displaced about and outside of etch chamber 75. As noted above, is however, it has been determined that sputter etch processes yield better device results (i.e., gate oxide charging, etc.) when the pulsed electromagnetic field is turned off and the etch is performed in a zero gauss state. In one prior art ILD reformation process embodiment, a sputter etch is performed at a pressure in the range of 100 mTorr with a magnetic field reduced to at, or near, zero, from a standard value of 50–60 gauss.

FIG. 8 illustrates a schematic top section view of wafer 90 that would undergo a sputter etch process as part of the fabrication process. Wafer 90 is divided into a plurality of individual devices. FIG. 8 shows wafer 90 and represents two individual devices, device 55 and device 60.

FIG. 9 graphically shows the typical etch rate of an argon sputter etch on a prior art semiconductor wafer. As illustrated in FIG. 9, the etch rate of an argon sputter etch varies across the wafer diameter. The duration of the sputter etch is typically calculated by determining a mean etch rate based on an etch rate profile such as presented in FIG. 9. FIG. 9 shows that for a 100 millimeter (mm) diameter wafer, the etch rate of an argon sputter etch process is much slower at the center of the wafer, such as for example at device 55, than at the outer portions of the wafer, such as for example at device 60. In practice, however, where device 55 and device 60 are similarly fabricated devices, it is desirable that device 55 and device 60 see the same or a similar etch rate. Unfortunately, current etch systems, such as the AMAT5000™ operated at high pressure and zero gauss, cannot provide the desired etch rate uniformity.

Etch rate uniformity is particularly important in ILD processing. In ILD processing, the sputter etch controls voids formed between metal lines by displacing first dielectric material in the areas between the metal lines and, if present, controlling voids to be small and to be below the metal surface. With an etch rate profile illustrated in FIG. 9 having a low performance etch rate represented by $Y_1$ (which is, for example, over device 55), the etch may not be sufficient to temper any voids or ensure that the voids are below the top surface of the metal lines. Such inefficient sputter etching and the presence of voids can lead to shorts. If, on the other hand, the etch rate performance is too great, such as for example as may be the case on the outer portions of wafer 90 and represented in FIG. 9 by $Y_2$ (which is, for example, the location of device 60), the etch can hit the top surface of a metal line and damage a gate oxide as discussed above.

SUMMARY OF THE INVENTION

A sputter etch system is disclosed. The sputter etch system includes an etch chamber with a wafer pedestal having a top surface to support a wafer, and a magnet configured to provide a continuous magnetic field directed at the top surface of the wafer pedestal. In a further aspect, a method of conducting a sputter etch is disclosed. The method includes providing a semiconductor wafer having a wafer surface, providing a sputter etch system including an etch chamber having a wafer pedestal with a top surface to support a wafer and a magnet configured to provide a continuous magnetic field directed at the top surface of the wafer pedestal, placing the wafer on the pedestal, and exposing the wafer surface to a sputter etch.

Additional features and benefits of the invention will become apparent from the detailed description, figures, and claims set forth below.

DETAILED DESCRIPTION OF THE INVENTION

The invention relates to a sputter etch system and a method of conducting a sputter etch. In one aspect of the invention, the etch system utilizes a stationary magnet or magnets to improve the uniformity of a sputter etch of, for example, an ILD. The magnetic field lines created by the stationary magnets replace prior art non-magnetic or rotational magnetic fields to control the local plasma density and enhance etch rate uniformity. In another aspect, the system allows the user to configure the field lines of the stationary magnet(s) to optimize the etch process for a desired chamber configuration. In a third aspect, the invention relates to a method of conducting a sputter etch by placing a wafer in an etch system configured with a stationary magnet or magnets.

In the following detailed description, numerous specific details are set forth such as specific processes, process parameters, etc. in order to provide a thorough understanding of the invention. One skilled in the art will understand that these details need not be specifically employed to practice the invention. In other instances, well known details, including processes, are not set forth so as not to obscure the invention.

Figure 10:
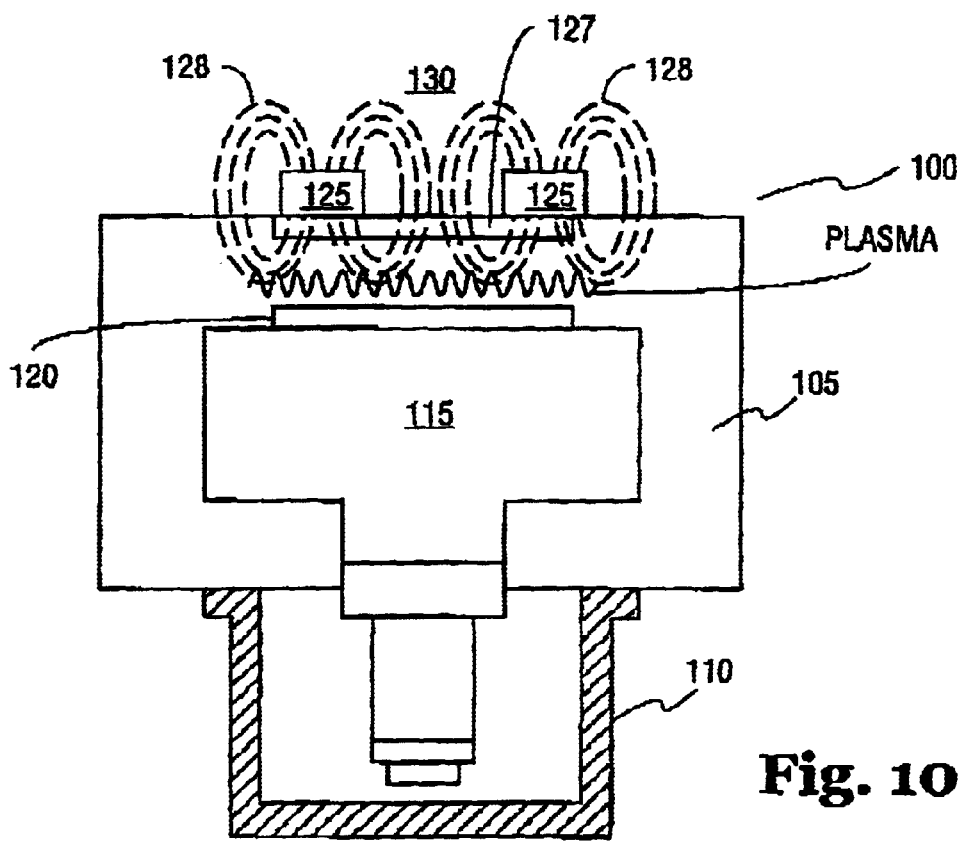
FIG. 10 shows a schematic, cross-sectional side view of an etch system in accordance with the invention.

FIG. 10 shows a cross-sectional side view of one embodiment of a sputter etch system in accordance with the invention. FIG. 10 shows etch system 100 having a base 110 and etch chamber 105. In the center of etch chamber 105 is a wafer pedestal 115 that supports wafer 120 during an etch process. In one embodiment, the distance between wafer 120 and the top inner surface of etch chamber 105 is approximately one inch. In this embodiment, etch system 100 also contains a gas distribution plate 127 located over wafer pedestal 115. A gas, such as an argon (Ar) gas is generated by RF power. Wafer 120 contains, for example, thousands of integrated circuit devices, each having a metal layer overlaid with a first layer of dielectric. Wafer 120 is exposed to a sputter etch in accordance with an embodiment of the invention to reshape the first layer of dielectric as described above with reference to FIGS. 1–5 and the accompanying text.

Coupled to the outer top surface of etch chamber 105 of etch system 100 is a stationary magnet 125. In this example, stationary magnet 125 is annularly-shaped and is displaced about the top surface of etch chamber 105. Stationary magnet 125 provides a non-fluctuating, non-pulsed magnetic field 130 in the area directly adjacent to the top surface of wafer 120. In other words, the annularly-shaped magnet 125 provides localized control of magnetic field 130 over the top surface of wafer 120. In this manner, the plasma of an argon sputter etch, for example, may be intensified by magnetic field 130 over wafer 120 to provide a more uniform etch. FIG. 10 shows magnetic field 128 directed at and in a direction perpendicular to or normal to the top surface of wafer pedestal 115.

The field strength of magnet 125 will vary depending on the desired characteristics of the etch. In one embodiment, an annularly-shaped magnet generating a magnetic field of approximately 25–50 gauss was utilized to intensify the plasma over wafer 120.

Figure 1:
FIG. 1 is a schematic, planar side view of a portion of a prior art integrated circuit structure having exposed metal lines.
Figure 2:
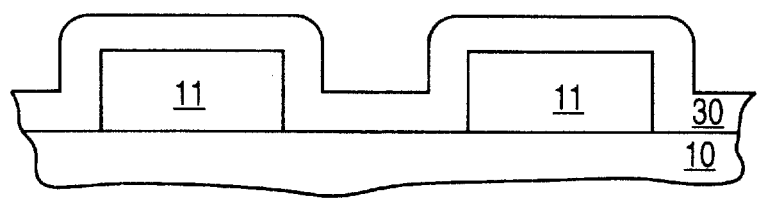
FIG. 2 is a planar side view of the portion of the integrated circuit structure of FIG. 1 showing the further processing step of depositing a first dielectric layer over the top surface of the integrated circuit structure.
Figure 3:
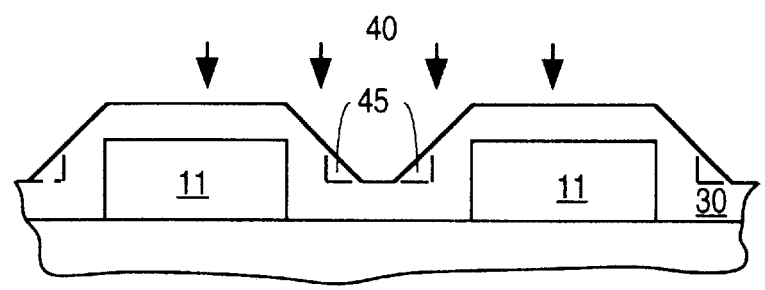
FIG. 3 is a planar side view of the portion of the integrated circuit structure of FIG. 1 showing the further processing step of reforming the first dielectric layer by an argon sputter etch.
Figure 4:
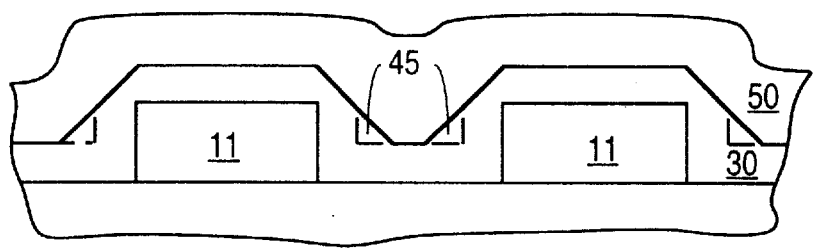
FIG. 4 shows a planar side view of the portion of the integrated circuit structure of FIG. 1 showing the further processing step of depositing a second dielectric layer over the integrated circuit structure.
Figure 5:
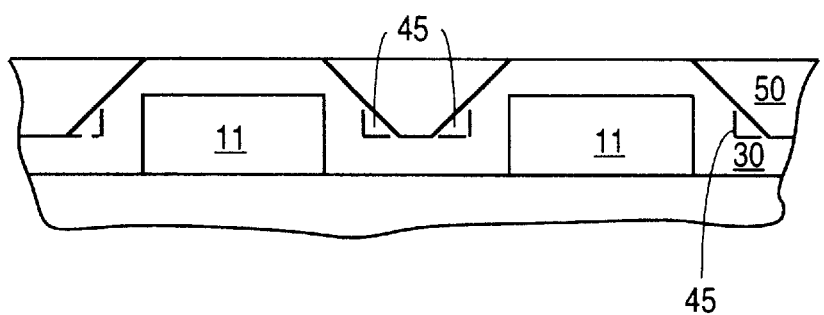
FIG. 5 shows a planar side view of the portion of the integrated circuit structure of FIG. 1 showing the further processing step of planarizing the dielectric layers.
Figure 6:
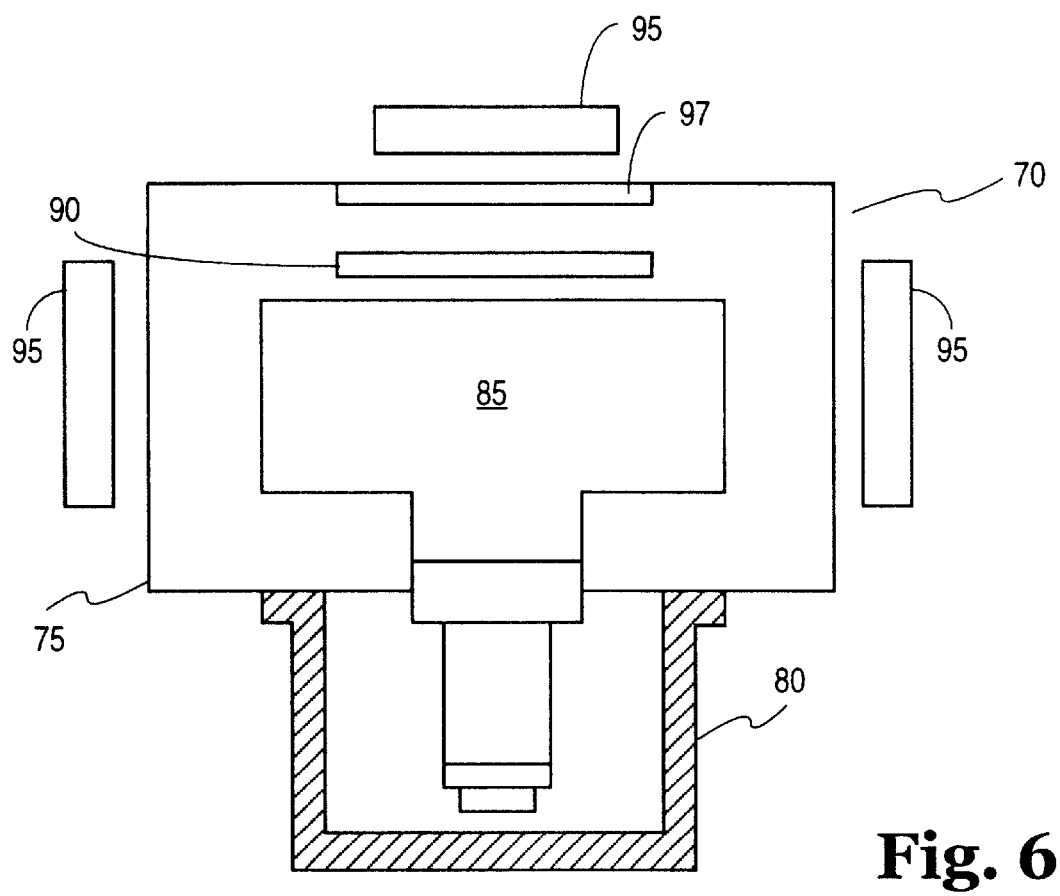
FIG. 6 shows a schematic cross-sectional side view of a prior art etch system.
Figure 7:
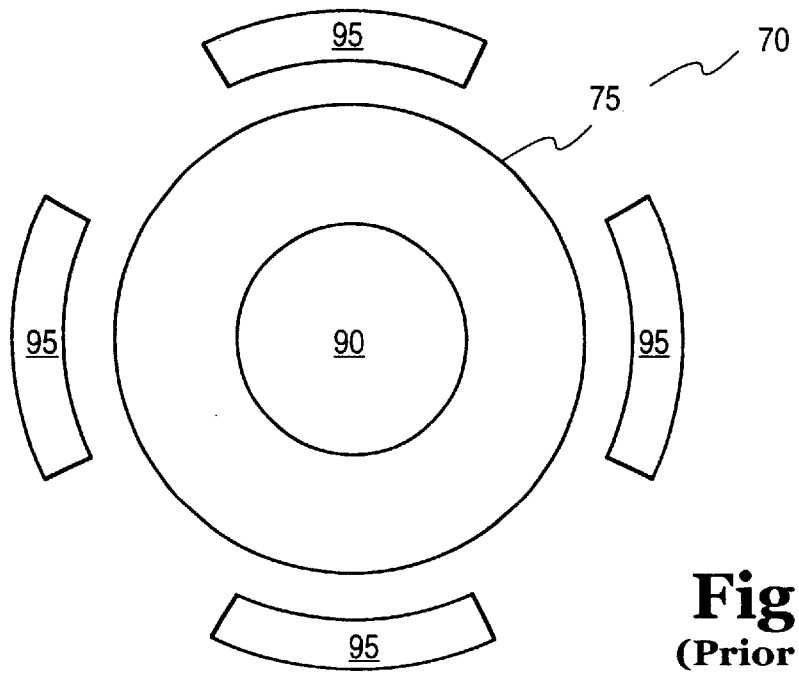
FIG. 7 shows a schematic, top view of the etch system of FIG. 6.
Figure 8:
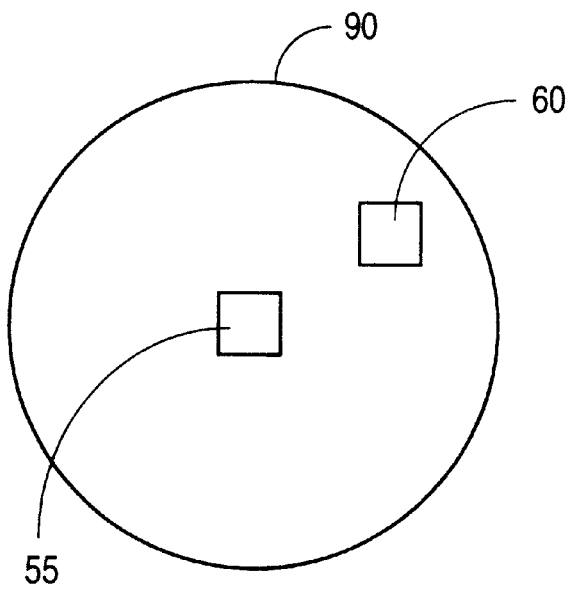
FIG. 8 shows a schematic, top view of a semiconductor wafer.
Figure 9:
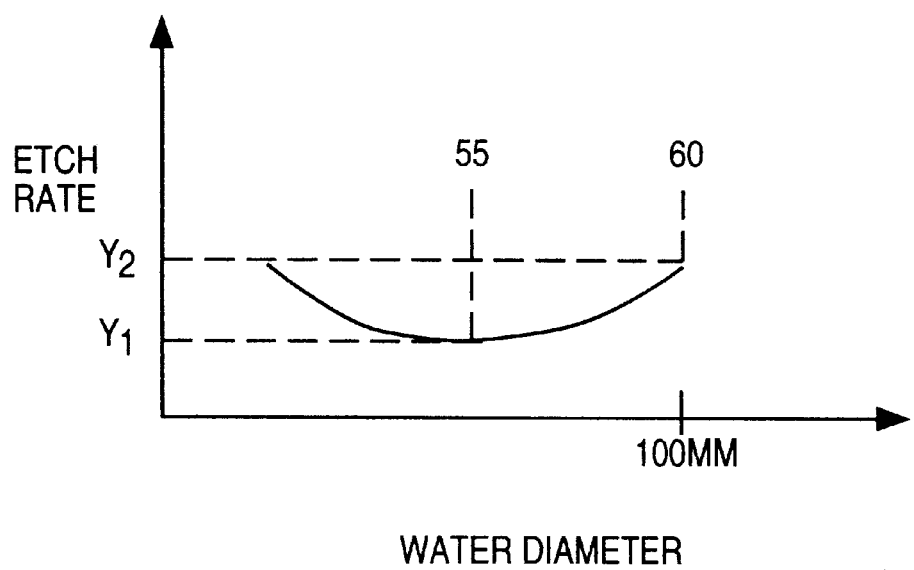
FIG. 9 graphically represents the etch rate of an argon sputter etch in terms of wafer diameter.
Figure 11:
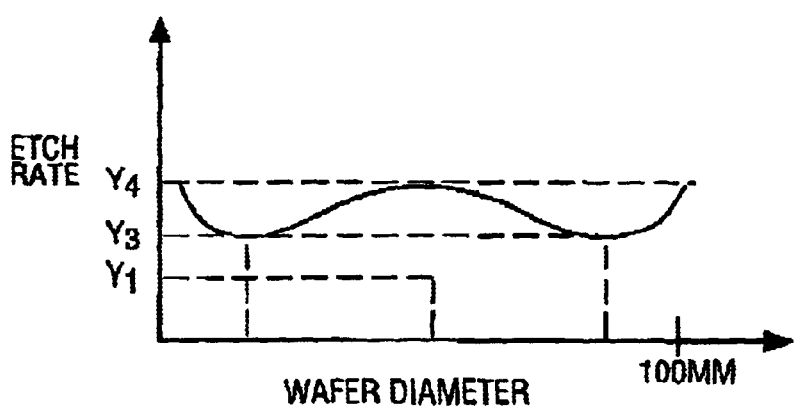
FIG. 11 shows a graphical representation of the etch rate of a sputter etch across a wafer diameter in accordance with an embodiment of the invention.

FIG. 11 is a graphical representation of the etch rate about a wafer in accordance with an embodiment of the invention. The etch rate profile of an argon sputter etch performed in accordance with an etch system utilizing a stationary, non-fluctuating magnet such as described in FIG. 10 produces a curve having a sinusoidal-like shape. The low spots of the etch rate curve represent areas of wafer 120 where the etch was least effective, while the high points represent areas of wafer 120 where the etch was more effective. The low spots, represented by $Y_3$, are seen to be greater than the low spot, represented by $Y_1$ in FIG. 9, seen in prior art sputter processes. Further, since the etch rate fluctuates in a sinusoidal-like fashion, the etch rate uniformity across wafer 120 is greatly improved over prior art sputter etch processes represented in FIG. 9. Thus, the determination of the duration for an effective etch based on a mean etch rate calculated on the etch rate demonstrated in FIG. 11 is much more reliable across the wafer than with prior art processes. Further, the etch achieved based on such a determination is much more consistent than prior art processes.

In one embodiment of a process for performing an argon sputter etch in accordance with the invention and to yield the etch rate illustrated in FIG. 11, the argon sputter etch process for an ILD sputter etch was run at 100 mTorr pressure, 400–700 watts RF power with fixed cathode and anode spacing. The amount of RF power will vary based on the diameter of the wafer. The amount of argon sputter for an ILD process is determined by the minimum required to taper for void-free fill on subsequent depositions and the maximum sputter possible without removing the dielectric layer from the top metal surface exposing the metal surface to physical and plasma damage. Sputter process parameters are well known in the art and can be adapted according to the invention to achieve the desired results. As shown in FIG. 11, the sinusoidal-like etch rate provides a more uniform etch of the wafer surface.

It is to be appreciated that there are many configurations for providing a stationary, non-fluctuating (i.e., non-pulsed) magnetic field localized at an area above the wafer. The stationary, non-fluctuating magnet or magnets could be placed, for example, on the inside or outside of the etch chamber on the top surface, side surfaces, or bottom surface of the etch chamber. The magnet could be a single magnet or a set of magnets, rectangularly-, annularly- or coil-shaped or a combination of these shapes. Further, in the case of multiple magnets used in combination, the magnetic fields of different magnets may be inverted.

Figure 12:
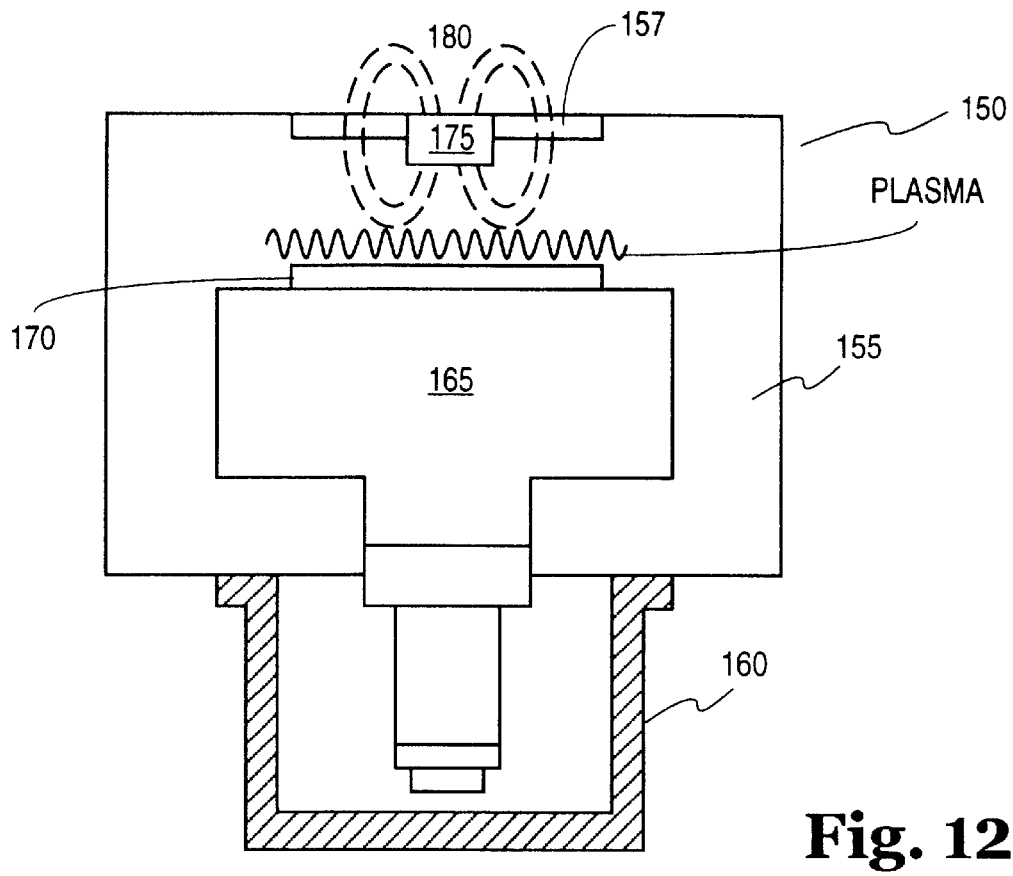
FIG. 12 shows a schematic, cross-sectional side view of an etch system in accordance with a second embodiment of the invention.

FIG. 12 shows a second embodiment wherein a single magnet 175 is placed inside etch chamber 155 of etch system 150. Etch system 150 includes a base 160 and etch chamber 155 with pedestal 165 supporting wafer 170. Etch system 150 also contains a gas distribution plate 157 located over pedestal 165. Magnet 175 directs a magnetic field 180 in the area directly encompassing the top surface of wafer 170. In FIG. 12, wafer 170 is located on top of pedestal 165 approximately one inch from magnet 175.

Figure 13:
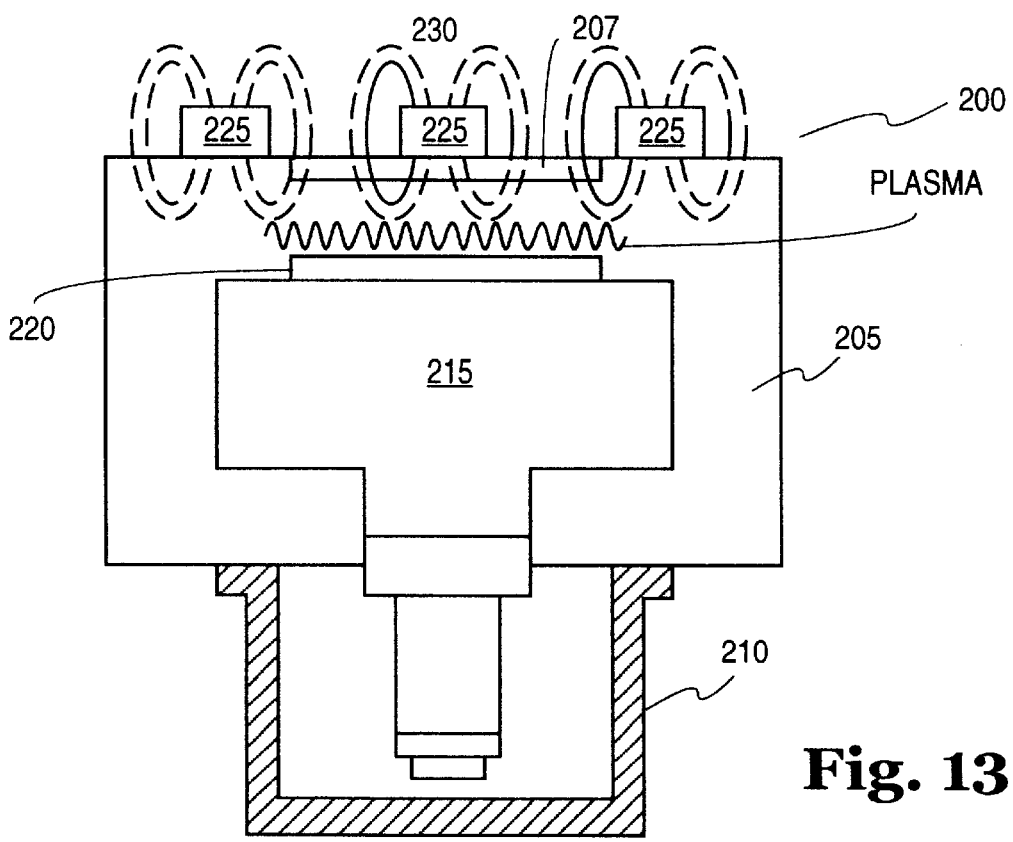
FIG. 13 shows a schematic, cross-sectional side view of an etch system in accordance with a third embodiment of the invention.

FIG. 13 shows a third embodiment of an etch system in accordance with the invention. In FIG. 13, etch system 200 includes a base 210 and etch chamber 205 with pedestal 215 supporting wafer 220. Etch system 200 also contains a gas distribution plate 207 over pedestal 215. In FIG. 13, stationary, non-fluctuating magnets 225 are placed on the outer surface of etch chamber 205 to concentrate a magnetic field 230 directly above wafer 220. In FIG. 13, magnets 225 may be three separate magnets or may be an annularly-shaped magnet surrounding a rectangular-shaped magnet. Various other configurations may be utilized to localize the magnetic field directly above a wafer in an etch chamber.

Figure 14:
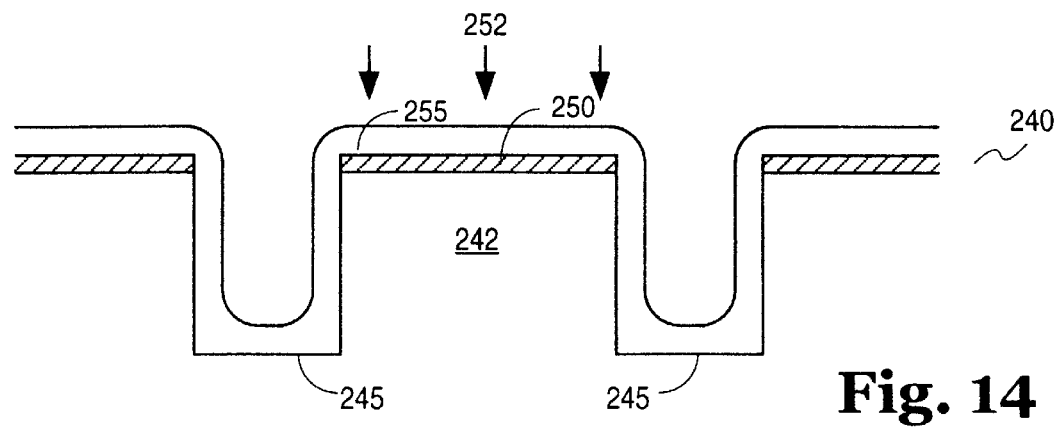
FIG. 14 shows a schematic, cross-sectional side view of a portion of an semiconductor structure having isolation trenches formed in the structure and a layer of dielectric materials deposited over the structure and in the isolation trenches in accordance with an embodiment of the invention.
Figure 15:
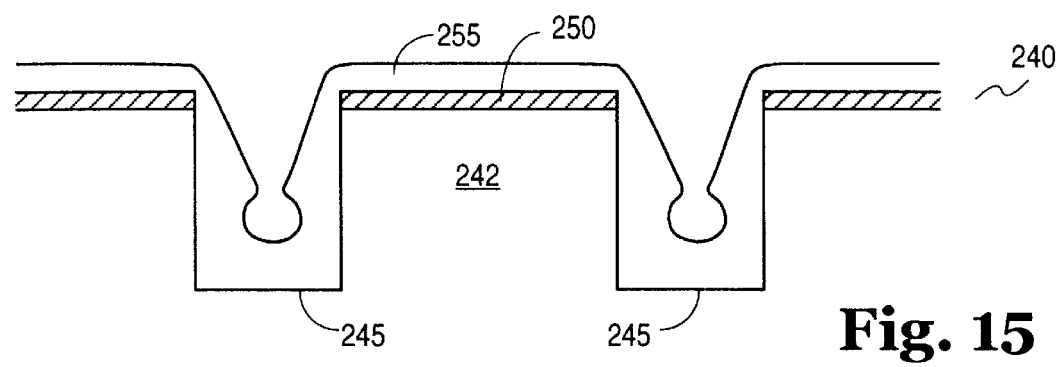
FIG. 15 shows a planar side view of the portion of the semiconductor structure of FIG. 14 after the top surface of the semiconductor structure has been exposed to a sputter etch.
Figure 16:
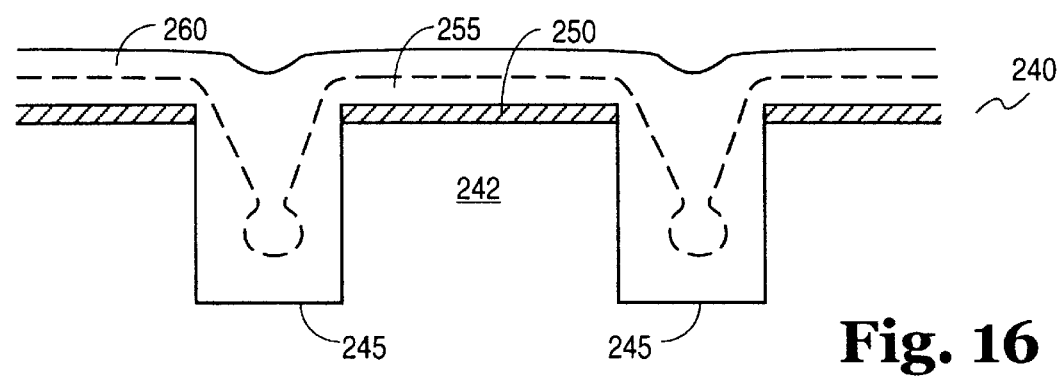
FIG. 16 is a planar side view of a portion of the semiconductor substrate of FIG. 14 and shows the further processing step of depositing a second dielectric layer over the substrate in accordance with an embodiment of the invention.

The invention contemplates use of a stationary, non-fluctuating magnetic field localized over a wafer wherever a sputter etch process is contemplated. For example, in addition to ILD processes, sputter etch processes are frequently used, for example, in forming isolation trenches. FIGS. 14–16 illustrate a method of forming isolation trenches in an integrated circuit. FIG. 14 shows a portion of an integrated circuit device 240 having two isolation trenches 245 formed in a semiconductor substrate 242. Overlying the top surface of semiconductor substrate 242 is a first dielectric layer 250, such as for example a silicon nitride layer. Deposited over first dielectric layer 250 and in trenches 245 is a second dielectric layer 255, such as for example a TEOS oxide layer. Dielectric layer 255 is deposited to a thickness that will not result in a "pinching-off" of dielectric material in isolation trenches 245, i.e., a blocking of access to the trenches by build up of material on the sidewalls near the top of the trenches. In the embodiment wherein dielectric layer 255 is an oxide, second dielectric layer 255 is deposited, for example, to a thickness of approximately 1,000 Å.

Next, as illustrated in FIG. 14, structure 240 is exposed to an etch back process, wherein an argon sputter etch (represented by reference No. 252) is utilized, in one instance, to pattern dielectric layer 255 in trenches 245. An argon sputter etch for a trench isolation process is operated with, for example, an AMAT500™ etch system at a pressure of 25 mTorr and 400–700 watts RF power with cathode/anode spacing fixed.

Figure 17:
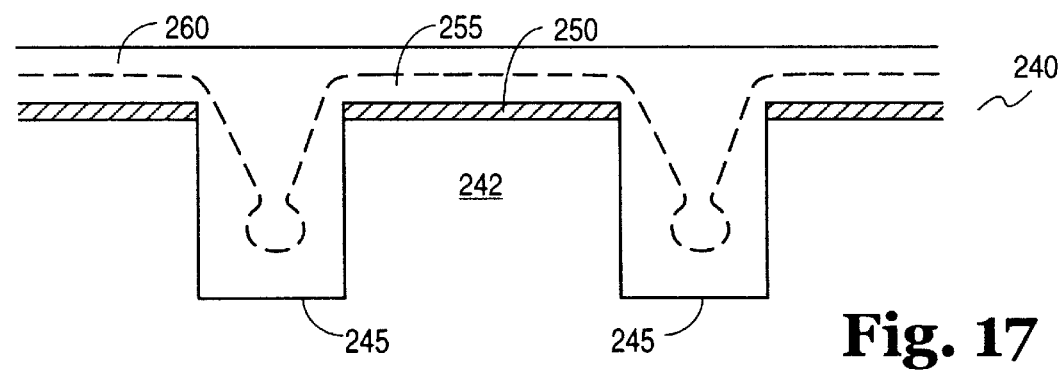
FIG. 17 is a planar side view of the semiconductor substrate of FIG. 14 showing the further processing step of planarizing the dielectric material over the structure in accordance with an embodiment of the invention.

FIG. 15 shows structure 240 after argon sputter etch 252. FIG. 15 shows that dielectric material 255 in trenches 245 has been manipulated so that dielectric material that was on the surface of semiconductor substrate 242 has been redeposited in trenches 245. In one embodiment, the thickness of dielectric layer 255 that is a TEOS oxide remaining on the surface of substrate 242 is approximately 500–800 Å. Next, as shown in FIG. 16, a third dielectric layer 260 is deposited over substrate 242, such as for example a TEOS oxide, to a thickness of approximately 6,000 Å. Next, as shown in FIG. 17, the top surface of structure 240 is planarized with, for example, a chemical-mechanical polish.

The sputter rate uniformity is important in trench isolation processes such as that described, because the deposition of total dielectric material, such as for example, total oxide material, is fairly thin, approximately 6,700–7,000 Å. For this reason, the percent error of the non-uniformity in etch rate is high. In a process such as described above with reference to FIGS. 14–17, the characteristics of the sputter etch can dominate the uniformity of the dielectric material left on the wafer after deposition chemical-mechanical polish. Thus, improving the etch characteristics of a sputter etch by improving the sputter etch system with a stationary, non-fluctuating magnet, or magnets to localize a magnetic field directly above a wafer greatly improves the uniformity of the etch rate in trench isolation processes.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of conducting a sputter etch:
   providing a semiconductor wafer having a wafer surface including a layer of dielectric material over a plurality of structures and a plurality of trenches;
   providing a sputter etch system including an etch chamber having a wafer pedestal with a top surface to support a wafer and a plurality of magnets coupled to said etch chamber and configured to provide a continuous magnetic field directed at and in a direction normal to said top surface of said wafer pedestal, wherein the plurality of magnets comprises an annular-shaped magnet surrounding a magnet that is other than annular shaped;
   placing said wafer on said pedestal; and
   exposing said wafer surface to a sputter etch, wherein the sputter etch includes redepositing into the plurality of trenches, a portion of the layer of dielectric material removed by the sputter etch from over the plurality of structures.

2. The method of claim 1, wherein providing a sputter etch system includes providing an etch chamber with an outer surface wherein said plurality of magnets are coupled to a top surface of said outer surface of said etch chamber.

3. The method of claim 1, wherein providing a sputter etch system includes providing the plurality of magnets with a shape and an axis and configured to provide a continuous magnetic field toward the axis.

4. The method of claim 1, wherein the plurality of magnets include providing the first magnet with an annular shape and a first axis and configured to provide a continuous magnetic field toward the axis and a second substantially annular shaped magnet having a diameter larger than said first magnet and a second axis and configured to provide a continuous magnetic field toward the second axis.

5. The method of claim 1, wherein providing a semiconductor wafer includes providing a wafer having a wafer surface including a layer of dielectric material conformally deposited in said trenches.

6. A method of conducting a sputter etch:
   providing a semiconductor wafer having a wafer surface including a layer of dielectric material over a plurality of structures and a plurality of trenches;
   providing a sputter etch system including an etch chamber having a wafer pedestal with a top surface to support a wafer and a coil-shaped magnet coupled to said etch chamber and configured to provide a continuous magnetic field directed at and in a direction normal to said top surface of said wafer pedestal;
   placing said wafer on said pedestal; and
   exposing said wafer surface to a sputter etch, wherein the snuffer etch includes redepositing into the plurality of trenches, a portion of the layer of dielectric material removed by the sputter etch from over the plurality of structures.

7. The method of claim 6, wherein providing a sputter etch system includes providing an etch chamber with an outer surface wherein said magnet is coupled to a top surface of said outer surface of said etch chamber.

8. The method of claims 6, wherein providing a sputter etch system includes providing a magnet with a substantially annular shape and an axis and configured to provide a continuous magnetic field.

9. The method of claim 6, where in providing a sputter etch system includes providing a first magnet with a substantially annular shape and a first axis and configure to provide a continuous magnetic field toward the axis and a second substantially annular shaped magnet having a diameter larger than said first magnet and a second axis and configured to provide a continuous magnetic field toward the second axis.

10. The method of claim 6, wherein providing a semiconductor wafer includes providing a wafer having a wafer surface including a layer of dielectric material conformally deposited in said trenches.

* * * * *

UNITED STATES PATENT AND TRADEMARK OFFICE
CERTIFICATE OF CORRECTION

PATENT NO.   : 6,645,353 B2
DATED        : November 11, 2003
INVENTOR(S)  : Huff et al.

It is certified that error appears in the above-identified patent and that said Letters Patent is hereby corrected as shown below:

Column 2,
Line 37, before "however", delete "is".

Signed and Sealed this

Twenty-third Day of March, 2004

JON W. DUDAS
*Acting Director of the United States Patent and Trademark Office*